(12) United States Patent
Lee et al.

(10) Patent No.: US 8,377,632 B2
(45) Date of Patent: Feb. 19, 2013

(54) METHOD OF REDUCING MICROLOADING EFFECT

(75) Inventors: Hsiu-Chun Lee, Taipei (TW); Yi-Nan Chen, Taipei (TW); Hsien-Wen Liu, Taoyuan County (TW)

(73) Assignee: Nanya Technology Corp., Kueishan, Tao-Yuan Hsien (TW)

( * ) Notice: Subject to any disclaimer, the term of this patent is extended or adjusted under 35 U.S.C. 154(b) by 73 days.

(21) Appl. No.: 13/118,447

(22) Filed: May 29, 2011

(65) Prior Publication Data

US 2012/0301833 A1 Nov. 29, 2012

(51) Int. Cl.
*G03F 7/26* (2006.01)
(52) U.S. Cl. ........................................... 430/314
(58) Field of Classification Search .................. 430/314, 430/322, 323, 316
See application file for complete search history.

(56) References Cited

U.S. PATENT DOCUMENTS

2006/0199366 A1 9/2006 Eda
2007/0212650 A1* 9/2007 Sim ................................. 430/313

* cited by examiner

*Primary Examiner* — Kathleen Duda
*Assistant Examiner* — Caleen Sullivan
(74) *Attorney, Agent, or Firm* — Winston Hsu; Scott Margo

(57) ABSTRACT

The present invention provides a method of reducing microloading effect by using a photoresist layer as a buffer. The method includes: providing a substrate defined with a dense region and an isolated region. Then, a dense feature pattern and an isolated feature pattern are formed on the dense region and the isolated region respectively. After that, a photoresist layer is formed to cover the isolated region. Finally, the substrate and the photoresist layer are etched by taking the dense feature pattern and the isolated feature pattern as a mask.

12 Claims, 2 Drawing Sheets

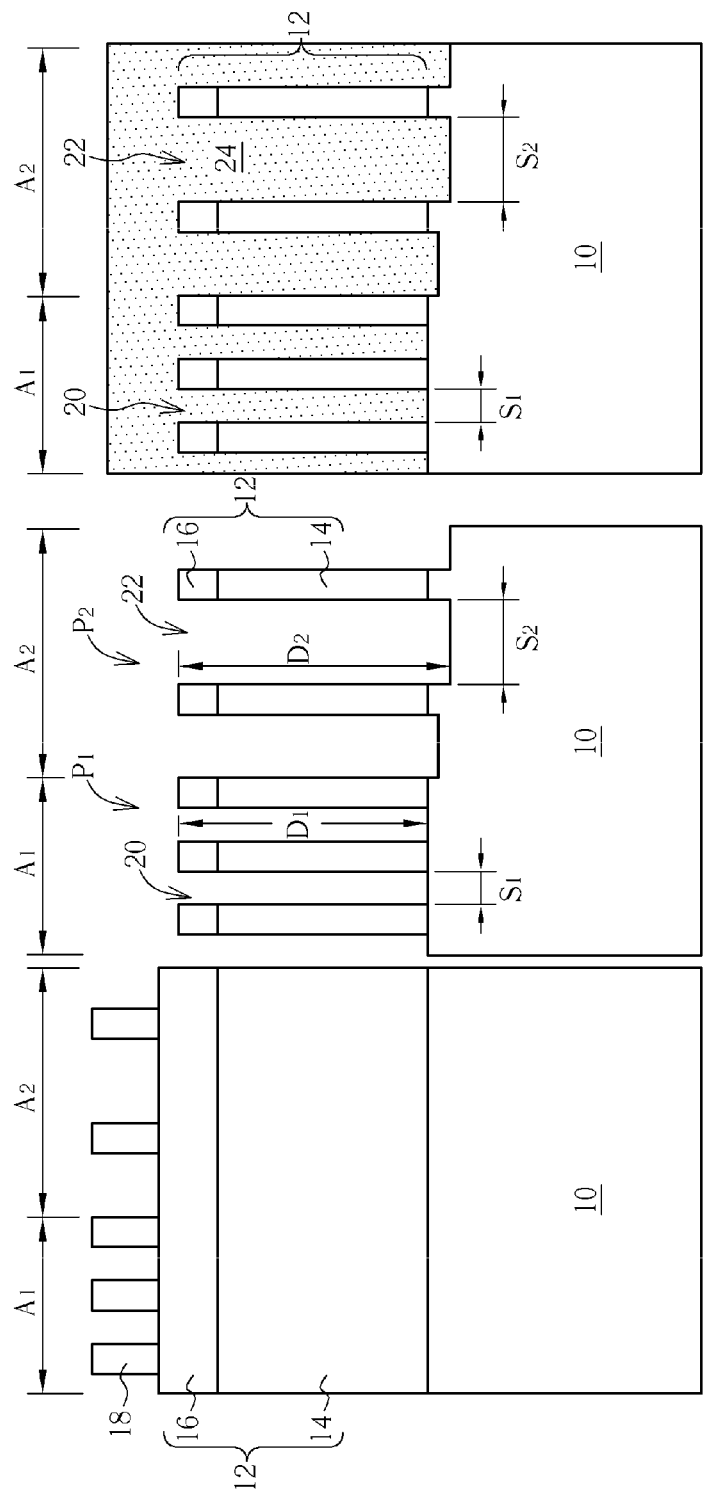

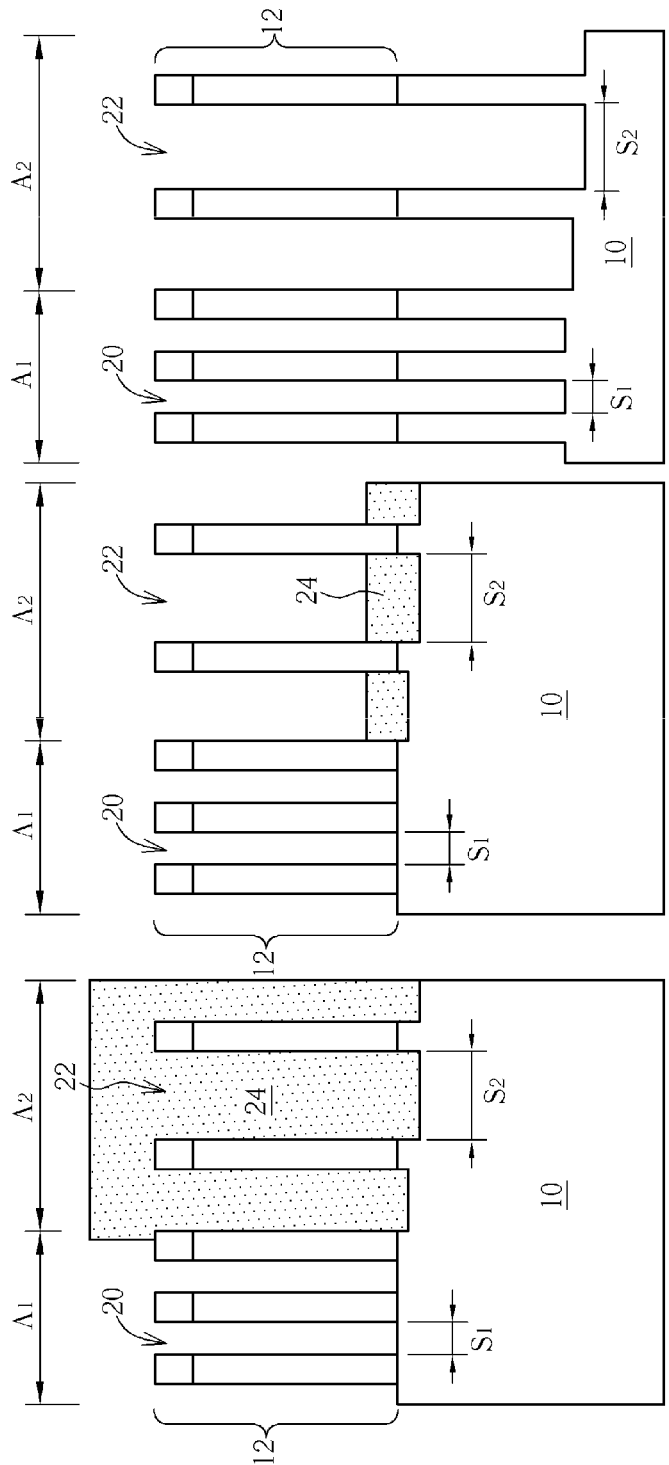

METHOD OF REDUCING MICROLOADING EFFECT

BACKGROUND OF THE INVENTION

1. Field of the Invention

The present invention relates to a method of reducing microloading effect, and more particularly, to a method of reducing microloading effect in a dry etching process.

2. Description of the Prior Art

Electronic devices, such as integrated circuits, are formed by many processes such as deposition, oxidation and etching. In a typical etching process, a patterned mask is formed on the substrate by a conventional lithographic process, and thereafter, exposed portions of the substrate are etched away with energized gases.

An ideal etching process must transfer the pattern on a mask layer to an underlying layer accurately, and also stop at a predetermined depth. However, since the etching process removes a target material both chemically and physically, the etching process is very sensitive to a lot of environmental parameters. One of the most challenging factors in traditional etching control is the microloading effect. Generally speaking, a semiconductor substrate subjected to an etching process is to define a pattern with a plurality of regions. The regions may be distributed with a high density of features and relatively few and isolated features.

Under the chemical and physical reacting mechanism of the etching process, the characteristics of etching are different under the variations of pattern size and density. Because of the microloading effect, different pattern regions are etched to different depths.

SUMMARY OF THE INVENTION

The present invention aims at resolving or eliminating the microloading effect to reach a uniform depth in both dense region and isolated region.

According to one aspect of the invention, a method of reducing microloading effect, includes the step of: providing a substrate defined with a dense region and an isolated region. Then, a dense feature pattern and an isolated feature pattern are formed on the dense region and the isolated region respectively. After that, a photoresist layer is formed to cover the isolated region. Finally, the substrate and the photoresist layer are etched by taking the dense feature pattern and the isolated feature pattern as a mask.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings:

FIG. 1 to FIG. 6 are schematic diagrams showing a method of reducing microloading effect.

It should be noted that all the figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

In the following description, numerous specific details are given to provide a thorough understanding of the invention. However, it will be apparent to one skilled in the art that the invention may be practiced without these specific details. In order to avoid obscuring the present invention, some well-known system configurations and process steps are not disclosed in detail.

Likewise, the drawings showing embodiments of the apparatus are semi-diagrammatic and not to scale and, particularly, some of the dimensions are for the clarity of presentation and are shown exaggerated in the figures. Also, in which multiple embodiments are disclosed and described having some features in common, for clarity and ease of illustration and description thereof, like or similar features will ordinarily be described with like reference numerals.

FIG. 1 to FIG. 6 are schematic diagrams showing a method of reducing microloading effect.

As shown in FIG. 1, firstly, a substrate 10 defined with a dense region $A_1$ and an isolated region $A_2$ is provided. The substrate 10 is covered with a mask layer 12 including first material layer 14 and a second material layer 16 formed on the substrate 10 from bottom to top. The first material layer 14 and the second material layer 16 are made of different materials. The first material layer 14 and second material layer 16 may include silicon nitride, silicon oxide or silicon. Then, a patterned photoresist 18 is formed on the second material layer 16.

As shown in FIG. 2, the mask layer 12 is etched for transferring the pattern on the patterned photoresist 18 to the mask layer 12 by taking the patterned photoresist 18 as a mask. Next, the patterned photoresist 18 is removed. After the etching process, the etched mask layer 12 has a dense feature pattern $P_1$ within the dense region $A_1$, and an isolated feature pattern $P_2$ within the isolated region $A_2$. The dense feature pattern $P_1$ defines a plurality of first recesses 20 with a first space $S_1$ between two adjacent first recesses 20. Each of the first recesses 20 has a first depth $D_1$. The isolated feature pattern $P_2$ defines a plurality of second recesses 22 with a second space $S_2$ between two adjacent second recesses 22. Each of the second recesses 22 has a second depth $D_2$.

Generally, the isolated region $A_2$ has a more isolated pattern than the dense region $A_1$ has. Therefore, the second space $S_2$ is preferably greater than the first space $S_1$. Specifically, the second space $S_2$ is greater than two time of the first space $S_1$. Usually, because of the microloading effect, the etching rate within the isolated region $A_2$ is faster than the etching rate within the dense region $A_1$. Therefore, when etching the mask layer 12, part of the substrate 10 within the isolated region $A_2$ is also etched. Consequently, the first depth $D_1$ is smaller than the second depth $D_2$. However, based on different operation factors, the first depth $D_1$ could be substantially equal to the second depth $D_2$.

As shown in FIG. 3, a photoresist layer 24 is formed blankly to cover the mask layer 12 and fills up the first recesses 20 and the second recesses 22. Please refer to FIG. 4, the photoresist layer 24 within the dense region $A_1$ is removed, and the photoresist layer 24 within the isolated region $A_2$ is remained. As shown in FIG. 5, the photoresist layer 24 within the isolated region $A_2$ is etched to a predetermined height. The predetermined height may be decided based on the size of the first space $S_1$ and the second space $S_2$. The photoresist layer 24 can be removed by a mixture oxide and nitrogen. As shown in FIG. 6, the substrate 10 and the remaining photoresist layer 24 are dry etched by taking the mask layer 12 as a mask. During the dry etch process, the remaining photoresist layer 24 serves as a buffer for the substrate 10 within isolated region $A_2$. In this way, the substrate 10 within the dense region $A_1$ and the isolated region $A_2$ can be etched evenly and the microloading effect can be reduced.

The present invention used the photoresist layer as a buffer, to prevent the substrate in the isolated region from being etched too fast. In this way, the substrate in the dense region and the isolated region can be dry etched uniformly.

Those skilled in the art will readily observe that numerous modifications and alterations of the device and method may be made while retaining the teachings of the invention.

What is claimed is:

1. A method of reducing microloading effect, comprising:
providing a substrate defined with a dense region and an isolated region;
forming a dense feature pattern and an isolated feature pattern on the dense region and the isolated region respectively;
forming a photoresist layer to cover the isolated region;
etching the photoresist layer to a predetermined height, thereby forming a buffer layer within the isolated region; and
etching through the buffer layer and then continuing to etch the substrate by taking the dense feature pattern and the isolated feature pattern as a mask.

2. The method of reducing microloading effect of claim 1, wherein the dense feature pattern and the isolated feature pattern are formed by steps of:
forming a mask layer on the substrate; and
etching the mask layer to form the dense feature pattern and the isolated feature pattern.

3. The method of reducing microloading effect of claim 2, wherein the mask layer comprises a first material layer and a second material layer covered on the first material layer.

4. The method of reducing microloading effect of claim 3, wherein the first material layer is made of a material different from that of the second material layer.

5. The method of reducing microloading effect of claim 2, wherein when etching the mask layer, part of the substrate within the isolated region is also etched.

6. The method of reducing microloading effect of claim 5, wherein the top surface of the substrate within the isolated region is lower than the top surface of the substrate within the dense region.

7. The method of reducing microloading effect of claim 1, wherein the dense feature pattern defines a plurality of first recesses with a first space between two adjacent first recesses.

8. The method of reducing microloading effect of claim 7, wherein the isolated feature pattern comprises a plurality of second recesses with a second space between two adjacent second recesses.

9. The method of reducing microloading effect of claim 8, wherein the second space is greater than the first space.

10. The method of reducing microloading effect of claim 9, wherein the second space is greater than two time of the first space.

11. The method of reducing microloading effect of claim 8, wherein the photoresist layer fills in the second recesses.

12. The method of reducing microloading effect of claim 8, wherein each of the second recesses is deeper than each of the first recesses.

* * * * *